(12) United States Patent
Skaug (10) Patent No.: US 11,784,562 B2
(45) Date of Patent: Oct. 10, 2023

(54) SWITCH ACTIVATION SYSTEM WITH FAST RECOVERY NEGATIVE VOLTAGE CHARGE PUMP AND CHARGE PUMP LOAD MONITORING

(71) Applicant: Silicon Laboratories Inc., Austin, TX (US)

(72) Inventor: Steffen Skaug, Oslo (NO)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/468,218

(22) Filed: Sep. 7, 2021

(65) Prior Publication Data

US 2023/0086910 A1    Mar. 23, 2023

(51) Int. Cl.
*H02M 3/07* (2006.01)

(52) U.S. Cl.
CPC .................................. *H02M 3/071* (2021.05)

(58) Field of Classification Search
None
See application file for complete search history.

(56) References Cited

U.S. PATENT DOCUMENTS

| | | | | |
|---|---|---|---|---|
| 8,462,578 B2* | 6/2013 | Neto | ...................... | H02M 3/073 365/233.1 |
| 8,660,502 B2* | 2/2014 | Wachi | ...................... | H04B 1/44 455/80 |
| 8,923,781 B2* | 12/2014 | Kunishi | ................. | H03K 3/354 455/425 |
| 8,963,618 B2* | 2/2015 | Keane | ................... | H03K 17/693 327/437 |
| 9,318,161 B2* | 4/2016 | Eguchi | ................. | G11C 29/021 |
| 9,379,604 B2* | 6/2016 | Zhong | ..................... | H02M 3/07 |
| 10,073,478 B1* | 9/2018 | Ivanov | ..................... | G05F 1/595 |
| 10,270,349 B2* | 4/2019 | Chen | ..................... | H02M 7/103 |
| 10,288,669 B2* | 5/2019 | Ilkov | .................. | G01R 31/2822 |
| 10,498,230 B1* | 12/2019 | Chen | ....................... | H02M 3/07 |
| 10,778,206 B2* | 9/2020 | Kolcuoglu | ........... | H03K 17/693 |
| 10,868,520 B2* | 12/2020 | Jo | .......................... | H03K 17/56 |
| 10,931,193 B2* | 2/2021 | Tokuda | ................ | H03K 17/687 |

* cited by examiner

*Primary Examiner* — Thomas J. Hiltunen
(74) *Attorney, Agent, or Firm* — Gary Stanford; Huffman Law Group, PC (57) ABSTRACT

A switch activation system including a charge pump, a load monitor, and a switch driver. The charge pump drives a negative voltage node to a predetermined negative voltage level. The load monitor monitors the charge pump and to assert a break done signal after the charge pump begins driving the negative voltage back to the predetermined negative voltage level after being increased. The switch driver turns on a first electronic switch in response to assertion of a corresponding activation signal and assertion of the break done signal. The break done signal is asserted only after electronic switches being turned off are fully turned off to avoid conflict. The charge pump operates at a frequency based on a difference between a voltage level of the negative voltage node and the predetermined negative voltage level to drive the negative voltage node back to its predetermined level within a predetermined period of time.

20 Claims, 5 Drawing Sheets

SWITCH ACTIVATION SYSTEM WITH FAST RECOVERY NEGATIVE VOLTAGE CHARGE PUMP AND CHARGE PUMP LOAD MONITORING

BACKGROUND OF THE INVENTION

Field of the Invention

The present invention relates in general to selective activation of multiple switches, and more particularly to a switch activation system with a fast recovery negative voltage charge pump and charge pump load monitoring.

Description of the Related Art

Many applications include multiple switches that route signals between active blocks and various pins. Some of the switches may have conflicts with other switches when turned on at the same time. A wireless communication system, for example, may operate with radio frequency (RF) signals that are conveyed through one or more of the switches at different times. A power amplifier may be coupled to an antenna by a first switch during transmission, whereas a low noise amplifier may be coupled to the antenna by a second switch during signal reception. Both of these RF devices, among other devices in the communication system, are high gain active devices in which it is important that they are fully isolated from each other to avoid feedback loops that may cause system instability. In this manner, it is important to turn an activated one of the first and second switches fully off before turning the other one on. As another example, multiple switches may be incorporated within a multiple terminal switching device having a common node, in which only one of the switches of the multiple terminal switching device may be turned on at time. In the general case, it is important to turn some switches fully off before turning some other switches on.

The switches may be configured to have a low threshold in order to achieve low on resistance for conveying RF signals or the like, such as, for example, MOS transistors or the like. To achieve sufficient off isolation, one or more of the switch terminals may be biased with a negative voltage. The gate and body terminals of an NMOS transistor, for example, may be driven negative to turn the transistor fully off. The low threshold switches, however, may have significant capacitance that must be charged or discharged before the switch fully turns off.

SUMMARY OF THE INVENTION

A switch activation system according to one embodiment includes a charge pump, a load monitor, and a switch driver. The charge pump may be configured to drive a negative voltage node to a predetermined negative voltage level. The load monitor may be configured to monitor the charge pump and to assert a break done signal after the charge pump begins driving the negative voltage back to the predetermined negative voltage level after having been increased. The switch driver may be configured to turn on a first one of multiple electronic switches in response to assertion of a corresponding activation signal and assertion of the break done signal.

The switch driver may be configured to couple a control terminal of an electronic switch to the negative voltage node in response to de-assertion of a corresponding activation signal to turn the electronic switch off. The switch driver may also be configured to couple a body connection of the electronic switch to the negative voltage node when being turned off.

Each of the electronic switches may be configured to load the negative voltage node while being turned off causing a voltage level of the negative voltage node to rise above the predetermined negative voltage level. The charge pump may be configured to operate at an increased frequency to drive the negative voltage node back to the predetermined negative voltage level within a predetermined period of time.

The switch activation system may include activation control circuitry that may be configured to control the activation signals, in which the activation control circuitry may be configured to assert a bypass signal to bypass the break done signal so that an electronic switch may be turned on without delay.

The switch driver may include switch activation circuitry and switch enable circuitry. The switch activation circuitry may be configured to couple a corresponding control terminal of an electronic switch to either one of a drive voltage and the negative voltage node based on a state of an on signal. The switch enable circuitry may be configured to control the on signal based on the break done signal and a corresponding activation signal. The switch activation circuitry may further be configured to couple a corresponding body connection of an electronic switch to either one of a supply reference node and the negative voltage node based on the state of the on signal.

The charge pump may include a voltage regulator, first and second pump circuitry, a self resetting comparator, and flip-flop circuitry. The voltage regulator is configured to generate a regulated target voltage level with respect to a reference voltage level, in which the regulated target voltage is indicative of a magnitude of the predetermined negative voltage level. The first pump circuitry may be configured to pump a differential voltage having a magnitude of the regulated target voltage level between the negative voltage node and a feedback node. The second pump circuitry may be configured to pump the negative voltage down from a reference voltage node having the reference voltage level by an amount of the regulated target voltage level. The self resetting comparator may be configured to compare a voltage of the feedback node with the reference voltage level to provide a pump signal having a frequency based on a voltage difference between the feedback node and the reference voltage level. The flip-flop circuitry has a clock input receiving the pump signal and may be configured to generate at least one pump signal used to drive the first pump circuitry and the second pump circuitry.

The load monitor may be configured as a current mirror configuration that is capacitively coupled to a feedback node of the charge pump indicative of a voltage level of the negative voltage node. The charge pump may be configured to operate at a frequency based on a difference between a voltage level of the negative voltage node and the predetermined negative voltage level.

A method of controlling activation of multiple electronic switches according to one embodiment includes pumping charge to drive a negative voltage node to a predetermined negative voltage level, monitoring a voltage level of the negative voltage node and asserting a break done signal when a voltage level of the negative voltage node is decreasing back to the predetermined negative voltage level after having been increased, detecting assertion of a first activation signal for turning on a corresponding first electronic switch, and turning on the corresponding first electronic switch only after the break done signal is asserted.

The method may include detecting de-assertion of a second activation signal for turning off a corresponding second electronic switch, and turning off the second electronic switch by coupling its control terminal to the negative voltage node. The method may include turning off the second electronic switch by also coupling its body connection to the negative voltage node.

The method may include detecting a voltage level of the negative voltage node increasing above the predetermined negative voltage level, and pumping charge at an increased frequency to drive the negative voltage node back to the predetermined negative voltage level within a predetermined period of time.

The method may include determining that the first electronic switch may be turned on without causing conflict with any of the other electronic switches, and asserting a bypass signal to bypass the break done signal with assertion of the first activation signal.

The method may include coupling a corresponding control terminal to either one of a drive voltage and the negative voltage node based on a state of an on signal, and controlling the on signal based on the break done signal and a corresponding activation signal. The method may include coupling a corresponding body connection to either one of a supply reference node and the negative voltage node based on a state of the on signal.

The method may include generating a regulated target voltage level with respect to a reference voltage level having a magnitude of the predetermined negative voltage level, pumping a differential voltage having a magnitude of the regulated target voltage level between the negative voltage node and a feedback node at a frequency of a pump signal, pumping the negative voltage down from a reference voltage node having the reference voltage level by an amount of the regulated target voltage level at a frequency of the pump signal, and comparing a voltage of the feedback node with the reference voltage level for generating the pump signal having a frequency based on a voltage difference between the feedback node and the reference voltage level.

The method may include holding an output node high during a steady state condition of current mirror circuitry having an intermediate node and the output node, inverting the output node for providing the break done signal, and momentarily pulling the output node low in response to the negative voltage node decreasing back to the predetermined negative voltage level after having been increased. The method may include pumping charge at a frequency level based on a difference between a voltage level of the negative voltage node and the predetermined negative voltage level.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A switch activation system with fast recovery negative voltage charge pump and charge pump load monitoring as described herein includes break before make operation to ensure that one or more activated switches are turned fully off before turning on another switch when the simultaneous activation might otherwise cause a conflict. Each of multiple switches includes a drive terminal and a body connection that are both driven to a predetermined negative voltage level to ensure that the switch is turned off. The switches may be configured as large MOS transistors or the like with large capacitance. The negative voltage is driven by a charge pump that quickly responds to an increase of the negative voltage when loaded by a switch that is being turned off. A load monitor monitors operation of the charge pump and asserts a break done signal in response to a break condition indicating that a switch being turned off is considered fully off. The break condition occurs when the negative voltage is recovering, meaning that the charge pump is decreasing the negative voltage back towards the predetermined negative voltage level in response to a load event. A switch driver includes switch enable circuitry that prevents a switch from being turned on until after the break done signal is asserted. A bypass function may be included to bypass the break done signal to turn a switch on more quickly when there is no activation conflict with other switches.

Figure 1:
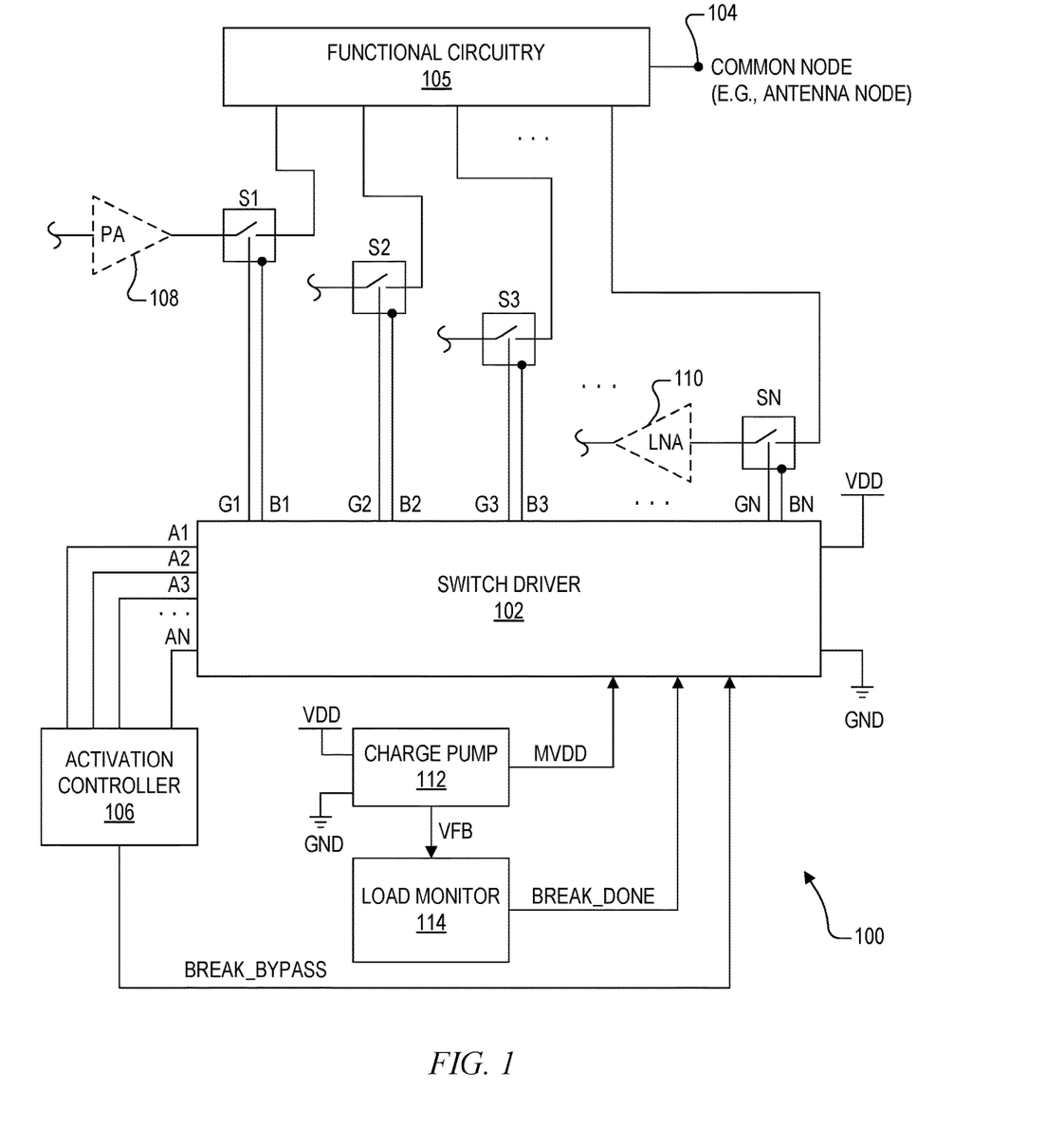
FIG. 1 is a simplified block diagram of a switch controller with a fast recovery negative voltage charge pump with load monitoring according to one embodiment of the present disclosure.

FIG. 1 is a simplified block diagram of a switch controller 100 with a fast recovery negative voltage charge pump with load monitoring according to one embodiment of the present disclosure. A switch driver 102 controls activation of a set of N electronic switches S1, S2, S3, . . . , SN (S1-SN) in response to a corresponding set of N activation signals A1, A2, A3, . . . , AN (A1-AN). The switches S1-SN are illustrated as single-pole, single-throw (SPST) switches coupled to functional circuitry 105. An activation controller 106 provides N activation signals A1-AN to command the switch driver 102 to assert or de-assert each of a set of N drive signals G1, G2, G3, . . . , GN (G1-GN) to turn on or turn off each of the switches S1-SN.

The switch controller 100 may be used for many different types of applications. In one embodiment, for example, the switch controller 100 may be used in a wireless communication system which includes a power amplifier (PA) 108 (shown coupled via switch S1) for transmitting and a low noise amplifier (LNA) 110 (shown coupled via switch SN) for receiving radio frequency (RF) signals via an antenna or the like coupled to a common node 104 via the functional circuitry 105, in which case the common node 104 serves as an antenna node. The PA 108 and the LNA 110 are high gain devices in which only one may be coupled to the antenna node at a time. The activation controller 106 is configured, therefore, to assert only one of the activation signals A1 and AN at a time to prevent conflict between the PA 108 and the LNA 110. In addition, the switch controller 102 is configured to ensure that an activated one of the switches S1 or SN is completely turned off (referred to herein as "break done") before the other one is turned on to protect against unwanted feedback paths that could cause instabilities.

Although wireless communications are used as an example of preventing conflict between multiple switches, it is understood that a fast recovery negative voltage charge pump with load monitoring as described may be used for many other types of applications. The common node 104, for example, may be a common node of a multiple terminal switch (not shown) incorporating two or more up to all of the switches S1-SN, in which case only one of the switches included within the multiple terminal switch may be activated at a time. In the alternative or in addition, the functional circuitry 105 may be configured such one or more of the switches S1-SN may need to be turned off before another one or more of the switches S1-SN are turned on.

In one embodiment, the switches S1-SN are configured as MOS type switches, such as N-channel MOS (NMOS) transistors or the like, with low voltage thresholds to achieve very low on resistance. The drive signals G1-GN are configured as gate drive signals to drive the gate terminals of the NMOS transistors implementing the switches S1-SN. In addition, each of the switches S1-SN incudes a body connection coupled to a corresponding one of N body drive nodes B1, B2, B3, . . . , BN (B1-BN) provided by the switch driver 102. In order to completely turn off NMOS transistor devices and to achieve good off isolation from other switches and circuitry, the gate and body terminals of each of the NMOS transistor devices should be pulled low to a negative voltage level or at least negative relative to a reference supply voltage level.

In one embodiment, the switch driver 102 receives power from a positive supply voltage VDD relative to a reference supply voltage such as ground (GND). GND may actually be any suitable negative, positive or zero voltage level so long as the voltage difference between GND and VDD is at least a predetermined supply voltage level. The switch controller 100 includes a charge pump 112 that develops a "negative" voltage MVDD (meaning that it has a voltage level that is negative with respect to GND), in which MVDD is provided to the switch driver 102. As described further herein, MVDD is regulated to a programmable voltage level target, independent of the supply voltage VDD. In order to turn off one of the switches S1-SN, the switch driver 102 couples a corresponding one of the drive signals G1-GN and a corresponding one of the body drive nodes B1-BN to MVDD. Loading events occur when one or more of the switches S1-SN are being turned off causing MVDD to rise above its voltage level target. Any switch being turned off is not considered fully turned off until MVDD has largely recovered back to its voltage level target. So fast recovery of MVDD is desired in order to meet the fast switching time requirement of many applications.

The switch driver 102 operates according to "break before make" in which it waits until a BREAK_DONE signal is asserted to ensure that one or more of the switches S1-SN that are being turned off are fully turned off before turning on another switch. The switch controller 100 includes a load monitor 114 that monitors a feedback voltage VFB from the charge pump 112 to determine when to assert the BREAK_DONE signal indicating that one or more switches being turned off are considered fully off. The switch driver 102 switches the gate and body terminals of switches being turned off to MVDD to turn them fully off and then waits until BREAK_DONE is asserted before turning on one or more other switches that may pose a conflict with switches being turned off.

In the case in which there are no switch conflicts when the activation controller 106 asserts an activation signal, the activation controller 106 may also assert a pulse a BREAK_BYPASS signal, which is provided to another input of the switch driver 102. The BREAK_BYPASS signal is pulsed at about the same time as an activation signal is asserted to effectively bypass the BREAK_DONE signal since the break before make mechanism is not required for the applied switching operation. In this manner, the corresponding switch may be turned on quickly without delay.

Figure 2:
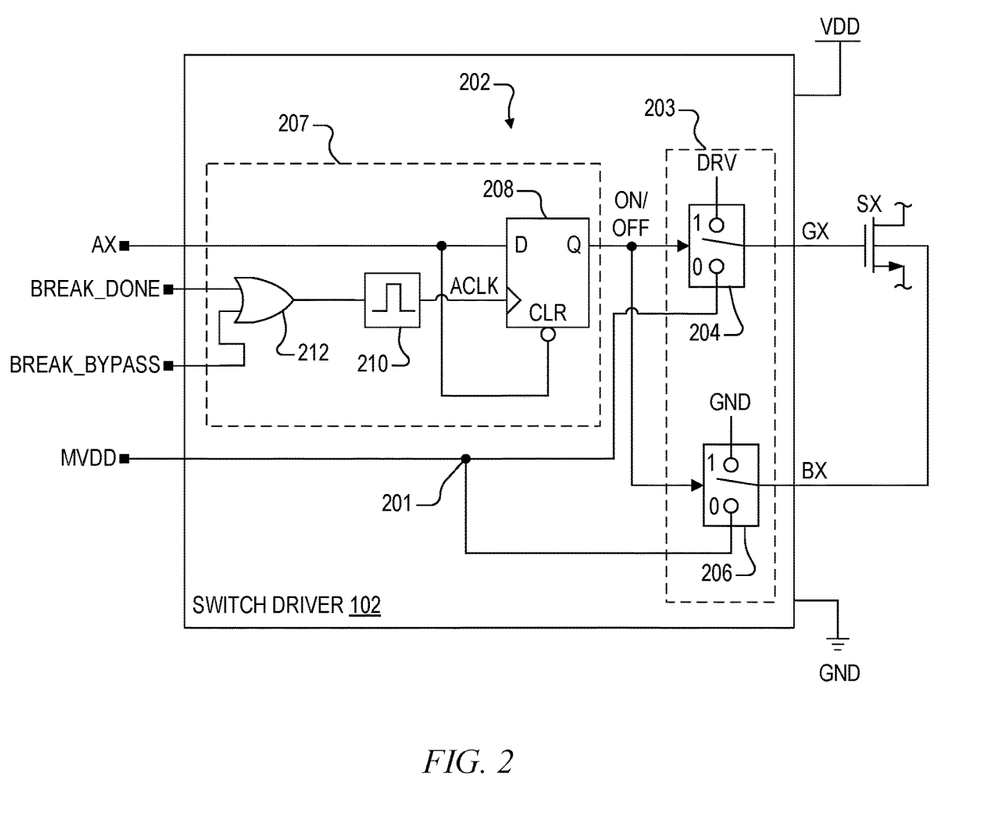
FIG. 2 is a simplified schematic and block diagram coupled to one of the switches of FIG. 1 configured as an NMOS transistor according to one embodiment of the present disclosure.

FIG. 2 is a simplified schematic and block diagram coupled to one of the switches S1-SN, shown as SX, which is configured as an NMOS transistor according to one embodiment of the present disclosure, in which "X" denotes an index value from 1 to N. The switch SX thus represents any one of the electronic switches S1-SN having a gate terminal receiving a gate drive signal GX (representing a corresponding one of G1-GN) from the switch driver 102 and having a body connection BX (representing a corresponding one of B1-BN) coupled to the switch driver 102. The switch driver 102 includes internal switch control circuitry 202 for controlling the state of the switch SX. It is understood that the switch driver 102 may include similar internal switch control circuitry 202 for each of the switches S1-SN, in which only one representative circuit is shown for purposes of illustration. Also, the internal switch control circuitry 202 is shown in simplified form for purposes of illustrating corresponding switch control functionality. MVDD is provided to a negative voltage node 201, which may be distributed to duplicate internal switch control circuitry 202 controlling each of the switches S1-SN.

The internal switch control circuitry 202 includes switch activation circuitry 203 and switch enable circuitry 207. The switch activation circuitry 203 includes a pair of single-pole, double throw SPDT switches 204 and 206. The switch enable circuitry 207 includes a D-type flip-flop (DFF) 208, pulse circuitry 210, and a Boolean Logic 2-input OR gate 212. The SPDT switch 204 selectively couples GX to either a drive voltage DRV or to MVDD based on an ON/OFF signal provided from the Q output of the DFF 208. A first switched terminal of the SPDT switch 204 is coupled to drive voltage DRV, which may be provided from drive circuitry (not shown) or may simply be the source voltage VDD. A second switched terminal of the SPDT switch 204 is coupled to node 201 for receiving MVDD. ON/OFF is provided to a control input of the SPDT switch 204. Similarly, the SPDT switch 206 selectively couples BX to either GND or MVDD based on the ON/OFF signal. A first switched terminal of the SPDT switch 206 is coupled to GND, a second switched terminal of the SPDT switch 204 is coupled to node 201 for receiving MVDD, and ON/OFF is provided to a control input of the SPDT switch 206. In one embodiment, when the DFF 208 asserts the ON/OFF signal to turn on the switch SX, GX is coupled to DRV and BX is coupled to GND, and when the DFF 208 de-asserts the ON/OFF signal to turn off the switch SX, both GX and BX are coupled to MVDD.

AX is provided to the D input and to an inverting clear (CLR) input of the DFF 208 of the switch enable circuitry 207. BREAK_DONE is provided to one input and BREAK_BYPASS is provided to the other input of the OR gate 212. The output of the OR gate 212 is coupled to an input of the pulse circuitry 210, having an output providing an activation clock signal ACLK to the clock input of the DFF 208.

In operation of the internal switch control circuitry 202, when AX is de-asserted low, the DFF 208 is cleared such that the ON/OFF signal is de-asserted or otherwise pulled low to turn off the switch SX. When the activation controller 106 asserts AX to turn on the switch SX, the DFF 208 is released from its cleared state. The ON/OFF signal, however, remains low until the DFF 208 receives a clock pulse. When BREAK_DONE is subsequently asserted high, the output of the OR gate 212 is asserted high causing the pulse circuitry 210 to output a clock pulse on ACLK to clock the DFF 208 so that the ON/OFF signal goes high to turn on the switch SX. In particular, GX is coupled to DRV and BX is coupled to GND to turn on the switch SX. In this manner, activation of the switch SX is delayed in response to assertion of AX until after BREAK_DONE is asserted. Once ACLK is pulsed high in response to BREAK_DONE being asserted, the ON/OFF signal is asserted and the switch SX is turned on very quickly.

When the activation controller 106 de-asserts AX to turn off the switch SX, the DFF 208 is immediately cleared to de-assert ON/OFF, so that both GX and BX are quickly coupled to MVDD. The switch SX, however, may be implemented as a relatively large switch with significant inherent capacitance. Although MVDD is driven negative by the charge pump 112 to turn SX off as quickly as possible, the voltage of MVDD may rise above its predetermined negative voltage level when loaded before the charge pump 112 is able to respond and pull MVDD back to its predetermined negative voltage level. When the load monitor 114 determines that the switch SX is fully turned off based on the level of MVDD, it asserts or otherwise pulses BREAK_DONE so that one or more of the other switches S1-SN may be turned on when activated by the activation controller 106.

The switch enable circuitry 207 may be omitted for any electronic switches S1-SN that do not pose a conflict to other electronic switches. For example, AX may be provided directly as the ON/OFF signal to directly control the SPDT switches 204 and 206 for a switch that does not pose a conflict. When the switch enable circuitry 207 is provided for a switch SX and when the activation controller 106 determines that the switch SX may be turned on regardless of the state of BREAK_DONE, such as when any possible conflicting switches have been turned off or when the BREAK_DONE signal would otherwise not be asserted (such as any conflicting electronic switches have already been turned off), it asserts the BREAK_BYPASS signal along with the AX signal to cause ACLK to be pulsed to turn on the switch SX without delay.

Figure 3:
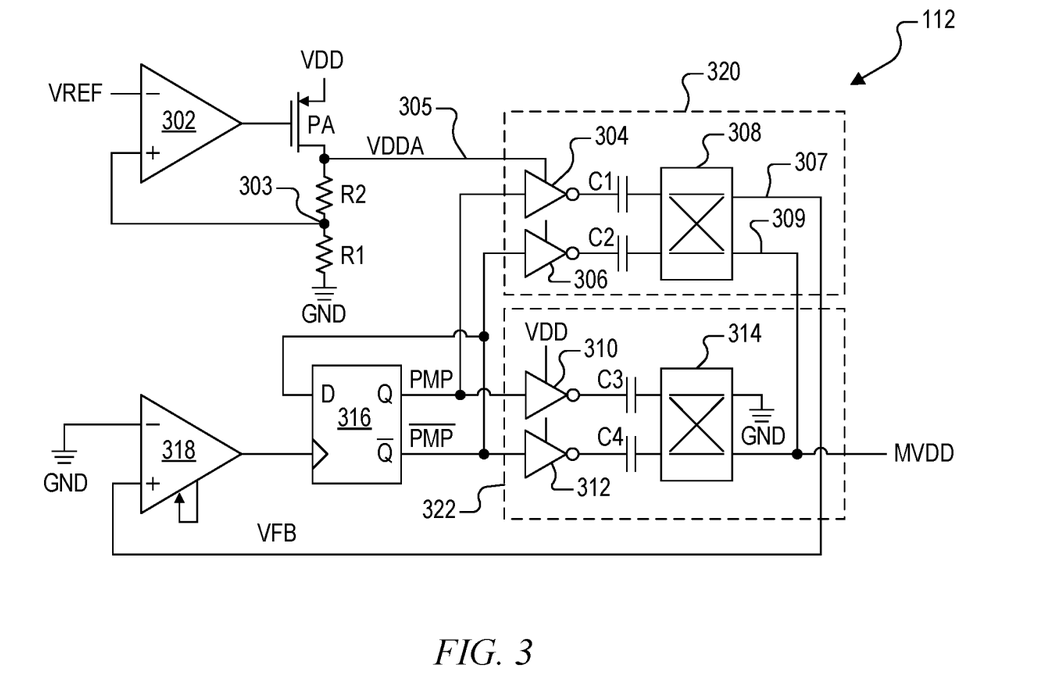
FIG. 3 is a schematic and part block diagram of the charge pump of FIG. 1 according to one embodiment of the present disclosure.

FIG. 3 is a schematic (and part block) diagram of the charge pump 112 according to one embodiment of the present disclosure. The charge pump 112 includes an operational amplifier (opamp) 302, a set of inverters 304, 306, 310, and 312, a pair of cross-coupled inverter (XC) circuits 308 and 314, a DFF 316 and a self-resetting high gain comparator 318. The opamp 302 has a negative (or inverting) input receiving a reference voltage VREF, a positive (or non-inverting) input coupled to a node 303, and an output coupled to a gate terminal of a P-channel MOS (PMOS) transistor PA. PA has a source terminal coupled to VDD and a drain terminal coupled to a node 305 developing a voltage VDDA. A first resistor R1 is coupled between node 303 and GND and a second resistor R2 is coupled between nodes 303 and 305. The voltage level of VREF and the resistance of resistors R1 and R2 are selected to so that VDDA has a target voltage level.

The voltage VDDA on node 305 is used as a source voltage for the inverters 304 and 306 and VDD is used as a source voltage for the inverters 310 and 312. The outputs of the inverters 304 and 306 are provided through capacitors C1 and C2, respectively, to first and second inputs, respectively, of the XC circuit 308. The outputs of the inverters 310 and 312 are provided through capacitors C3 and C4, respectively, to first and second inputs, respectively, of the XC circuit 314. The XC circuit 308 has first and second outputs coupled to nodes 307 and 309, respectively, and the XC circuit 314 has first and second outputs coupled to GND and the node 309, respectively. Node 307 develops the VFB feedback signal provided to a positive input of the comparator 318, and node 309 develops the MVDD voltage. The negative input of the comparator 318 is coupled to GND and its output is coupled to the clock input of the DFF 316. The DFF 318 has a non-inverting Q output generating a pump signal PMP provided to the inputs of the inverters 304 and 310, and has an inverting Q output (shown as $\overline{Q}$) generating an inverted pump signal $\overline{PMP}$ provided to the inputs of the inverters 310 and 312.

The opamp 302 drives PA to regulate node 303 to the voltage level of VREF, and the resistances of R1 and R2 are selected to drive VDDA to a predetermined target voltage level. VDDA has a voltage level relative to GND used to establish the magnitude of MVDD. The inverters 304 and 306, the capacitors C1 and C2 and the XC circuit 308 collectively form a first pump circuit 320 that drives a differential voltage between nodes 307 and 309 equal to VDDA in response to toggling of the PMP and $\overline{PMP}$ signals, and the inverters 310 and 312, the capacitors C3 and C4 and the XC circuit 314 collectively form a second pump circuit 322 that also drives a differential voltage between GND and node 309 equal to VDDA in response to toggling of the PMP and $\overline{PMP}$ signals. Because the upper output of the XC circuit 314 is coupled to GND and the lower outputs of the XC circuits 308 and 314 are coupled together, MVDD is driven to the predetermined negative voltage level having the same magnitude as VDDA.

VFB is a feedback voltage that is compared to GND by the comparator 318, which generates pulses at its output having a pump frequency based on a voltage difference between VFB and GND. These pulses are provided to the clock input of the DFF 316, which toggles both PMP and $\overline{PMP}$ at the pump frequency. In one embodiment, the comparator 318 is a high gain, self-resetting comparator. When VFB is at or near GND, the pump frequency is relatively low to keep the voltage difference between VFB and GND minimal. In response to a loading event caused by turning off one of the switches S1-SN causing MVDD to increase, the comparator 318 increases the pump frequency to a level that ensures that MVDD is quickly restored.

Figure 4:
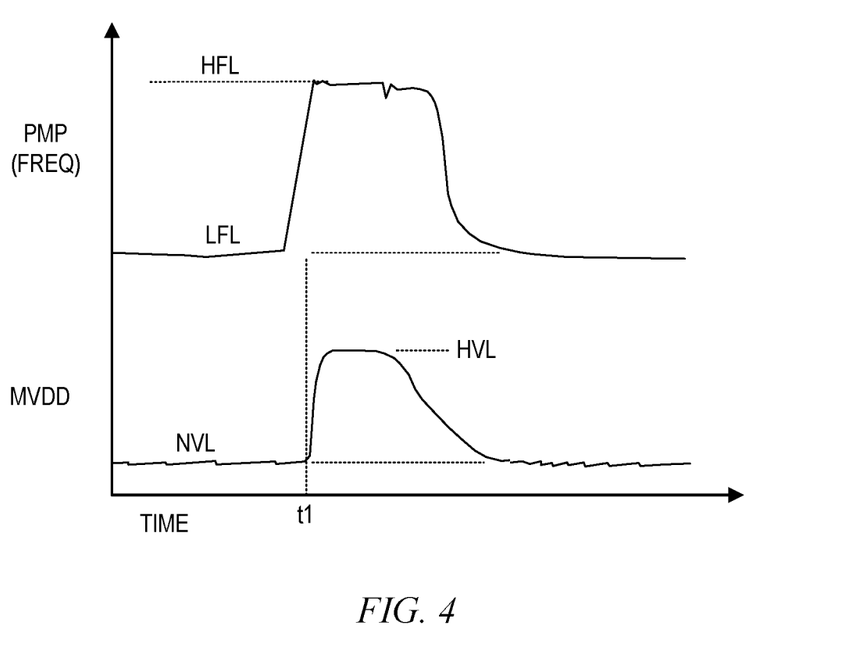
FIG. 4 is a timing diagram plotting the voltage level of the negative voltage MVDD and the corresponding frequency level of the pump signal PMP versus time according to one embodiment of the present disclosure.

FIG. 4 is a timing diagram plotting the voltage level of MVDD and the corresponding frequency level of PMP versus time according to one embodiment of the present disclosure. It is understood that the frequency of $\overline{PMP}$ is the same as PMP. Initially during static load conditions when an electronic switch is not being turned off, MVDD remains at a predetermined negative voltage level (NVL) while PMP has a relatively low frequency level (LFL). Generally, as MVDD slowly drifts above NVL, the charge pump 112 maintains the frequency of the PMP and $\overline{PMP}$ signals at the LFL to keep MVDD generally at NVL.

At about a time t1 when MVDD is coupled to the gate and body terminals of one of the electronic switches S1-SN (e.g., switch SX) to turn it off, the voltage level of MVDD rises above NVL up to a high voltage level (HVL) providing the charge to turn the electronic switch off. Although HVL may still be a negative voltage, it is significantly higher than NVL. When MVDD rises, VFB also rises above GND, the comparator 318 responds by increasing the frequency of its output causing pulses on PMP and $\overline{\text{PMP}}$ to toggle the pump circuits 320 and 322 to drive MVDD back to its predetermined negative voltage level NVL. As shown, for example, the frequency of PMP (and $\overline{\text{PMP}}$) jumps up to a high frequency level (HFL) to drive the pump circuits 320 and 322 at a significantly increased rate. Eventually, the voltage level of MVDD decreases back to NVL and the frequency of PMP and $\overline{\text{PMP}}$ decreases back to LFL.

In a more specific embodiment, VDD is about 3-4 Volts (V), VDDA is regulated to about 2.1V, so that MVDD has a target negative voltage level NVL of about −2.1V. VFB has a nominal voltage level of 0V (e.g., voltage level of GND), so that as MVDD is loaded causing it to rise above NVL, VFB rises above 0V and the charge pump 112 responsively drives MVDD back to NVL. The high frequency level HFL of PMP and $\overline{\text{PMP}}$ may be in the megahertz (MHz) range, such as, for example up to about 70 MHz to 100 MHz, although alternative frequency levels are contemplated. In one embodiment, the high frequency level HFL of PMP and $\overline{\text{PMP}}$ is selected to drive the pump circuits 320 and 322 to bring MVDD back to NVL within a maximum time period, such as about 1 microsecond (μs). Alternative embodiments may adjust timing as appropriate.

Figure 5:
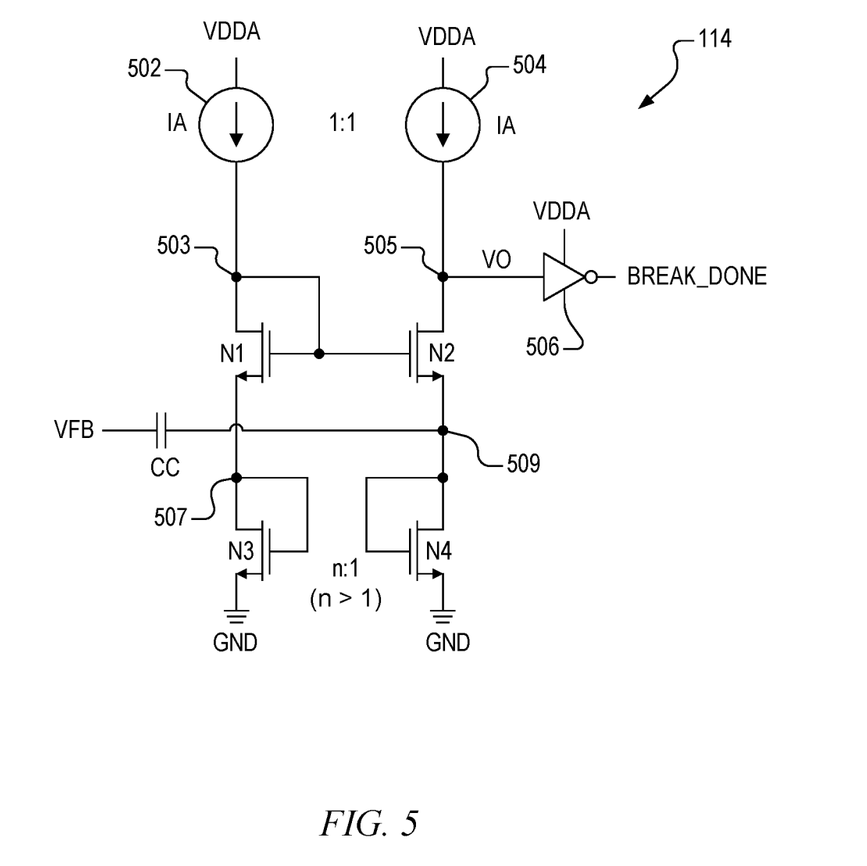
FIG. 5 is a schematic diagram of the load monitor of FIG. 1 according to one embodiment of the present disclosure.

FIG. 5 is a schematic diagram of the load monitor 114 according to one embodiment of the present disclosure. The load monitor 114 includes two current sources 502 and 504, an inverter 506, four NMOS transistors N1, N2, N3, and N4, and a capacitor CC. The current sources 502 and 504 are each referenced to the VDDA voltage and are substantially similar to each other with a 1:1 relationship to drive the same current level IA. The current source 502 drives IA into a node 503 and the current source 504 drives IA into a node 505 developing a voltage VO. N1 has drain and gate terminals coupled together at node 503 and has a source terminal coupled to a node 507. N2 has a drain terminal coupled to node 505, a gate terminal coupled to node 503, and a source terminal coupled to a node 509. N3 has drain and gate terminals coupled together at node 507 and a source terminal coupled to GND, and N4 has drain and gate terminals coupled together at node 509 and a source terminal coupled to GND. The capacitor has a first end receiving VFB and a second end coupled to node 509. The inverter 506 has an input coupled to node 505 to receive VO, has an output providing the BREAK_DONE signal, and has a source voltage input receiving VDDA. N3 and N4 have a size ratio relationship of n:1 in which n>1.

In operation of the load monitor 114, the current sources 502 and 504 drive an equal current level IA into nodes 503 and 504. In a steady state condition when VFB is stable at GND, N3 draws more current than N4 causing the voltage of node 505 and thus VO to remain at a high voltage level, such as VDDA. The inverter 506 thus keeps BREAK_DONE low. When MVDD is loaded causing it to increase, VFB also increases which drives the voltage of node 509 to initially increase. When VFB begins to decrease because of operation of the charge pump 112, the voltage VO momentarily decreases driving BREAK_DONE to momentarily go high. BREAK_DONE then goes back low as the charge pump 112 drives MVDD back to NVL and VFB back to GND.

Figure 6:
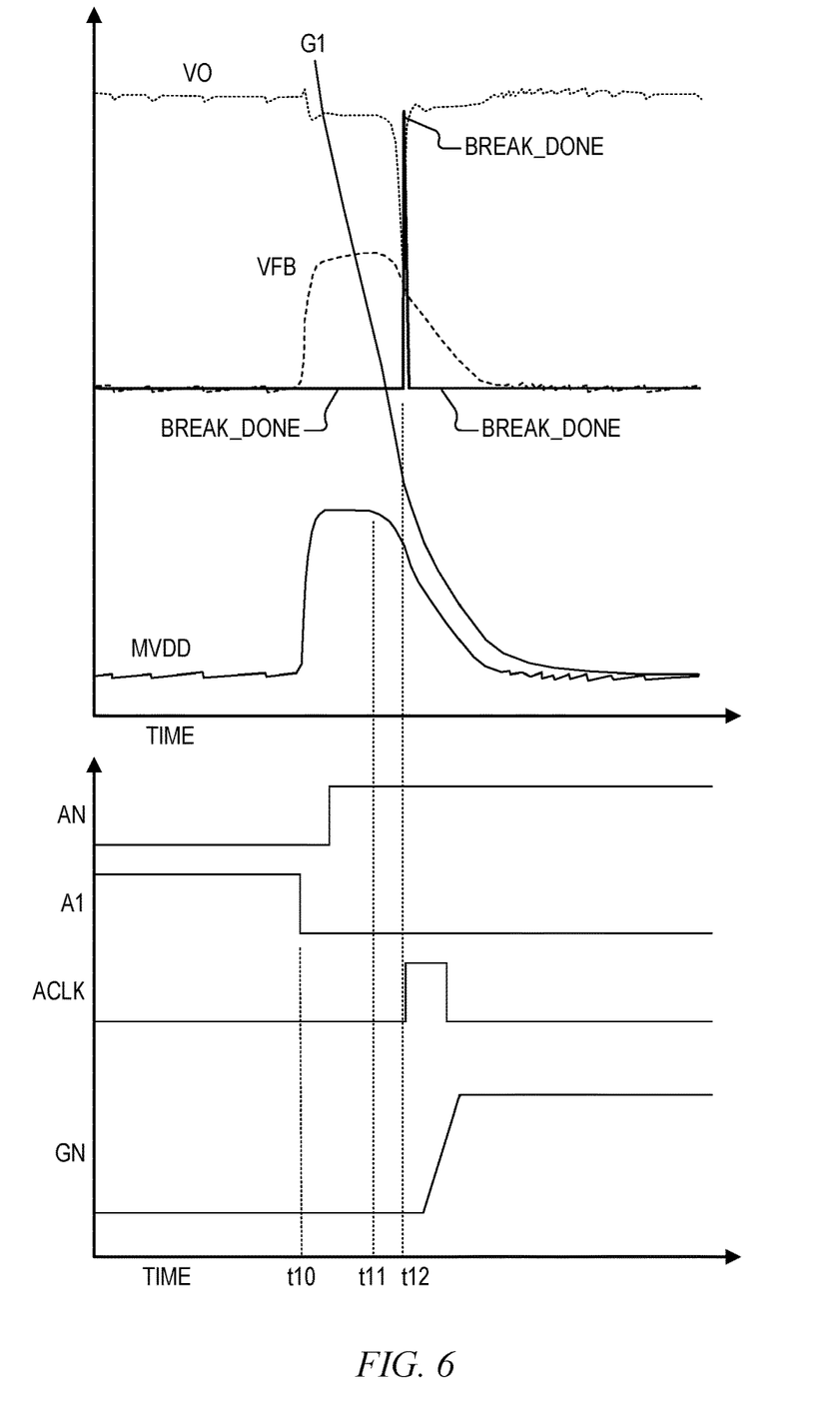
FIG. 6 is a pair of timing diagrams plotting various voltages and signals versus time illustration operation of the switch controller of FIG. 1 according to one embodiment of the present disclosure.

FIG. 6 shows a pair of timing diagrams including a first timing diagram plotting the voltages of VO (dotted line), MVDD, VFB (dashed line), G1 (for S1) and BREAK_DONE (bolded line) together versus time, and including a second timing diagram collectively plotting signals AN (for SN), A1 (for S1), ACLK, and GN versus time illustration operation of the switch controller 100 according to one embodiment of the present disclosure. GN is plotted in simplified manner as a signal in which it is understood that GN is a voltage having a scale similar to G1. The time scale for both timing diagrams is the same to illustrate relative timing between the signals and voltages. The voltages of VO, MVDD, VFB, G1 and BREAK are plotted together to more clearly illustrate timing of a loading event, although the full scale of G1 is not completely shown. Initially, AN is low and A1 is high so that switch SN is off while switch S1 is on. In this case, there is a conflict between switches S1 and SN so that SN should not be turned on until S1 is fully turned off. VFB, MVDD, BREAK, ACLK, and GN are initially low while G1 and VO are high.

At about a time t10, the activation controller 106 pulls A1 low to turn off switch S1 and then pulls AN high to turn on switch SN. Referring to FIG. 2 and assuming X is 1 for switch S1, when A1 is pulled low, the DFF 208 is cleared so that G1 is switched from DRV to MVDD while B1 is switched from GND to MVDD. G1 begins decreasing (not shown) and MVDD is loaded with the capacitance of switch S1 so that MVDD and VFB both increase as previously described. Switch S1 is turning off but is not considered fully off so that BREAK_DONE is not yet asserted. Referring to FIG. 2 and assuming X is N, when AN is pulled high, the DFF 208 is released from clear but his not yet clocked since BREAK_DONE is not yet asserted. Thus, GN and BN both remain low since coupled to MVDD. In this case, AN is pulled high to turn on switch SN before switch S1 has turned fully off.

Referring back to FIG. 6, at about time t11 MVDD and VFB begin going low as the charge pump 112 continues to pull G1 down to turn off switch S1. Eventually, VFB pulls VO momentarily low so that BREAK_DONE is momentarily pulled high at about time t12 before going back low. It is noted that BREAK_DONE may be pulled high before MVDD fully recovers back to its predetermined negative voltage level (e.g., NVL). When BREAK_DONE goes high, the OR gate 212 for switch AN asserts its output high and the pulse circuitry 210 asserts a clock pulse on ACLK to clock the DFF 208. Since AN is high, ON/OFF for switch SN goes high so that GN is switched to DRV and thus pulled high while BN is switched to GND, quickly turning on switch SN. In this manner, switch AN is turned on only after the load monitor 114 detects that switch S1 is fully turned off as indicated by BREAK_DONE momentarily going high.

It is noted that if the activation controller 106 detects that S1 was already fully off when it asserted AN high, such as either by detecting that BREAK_DONE is low or by other circuitry (not shown) that indicates that S1 is already off, then BREAK_DONE would not be asserted and SN would otherwise remain off. In this case, when the activation controller asserts AN high, it also simultaneously momentarily pulses the signal BREAK_BYPASS high so that the OR gate 212 bypasses BREAK_DONE to clock the DFF 208. In that case, switch SN is turned on without delay since not having to wait for any other of the electronic switches S1-SN to turn off.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A switch activation system, comprising:
a charge pump that is configured to drive a negative voltage node to a predetermined negative voltage level;
a load monitor that is configured to monitor the charge pump and to assert a break done signal after the charge pump begins driving the negative voltage back to the predetermined negative voltage level after having been increased; and
a switch driver that is configured to turn on a first one of a plurality of electronic switches in response to assertion of a corresponding first one of a plurality of activation signals, wherein the switch driver is configured to prevent the corresponding first activation signal from turning on the first one of the plurality of electronic switches until after assertion of the break done signal.

2. The switch activation system of claim 1, wherein the switch driver is configured to couple a control terminal of a second one of the plurality of electronic switches to the negative voltage node in response to de-assertion of a corresponding second one of the plurality of activation signals.

3. The switch activation system of claim 2, wherein the switch driver is configured to couple a body connection of the second one of the plurality of electronic switches to the negative voltage node in response to de-assertion of the corresponding second one of the plurality of activation signals.

4. The switch activation system of claim 1, wherein each of the plurality of electronic switches is configured to load the negative voltage node while being turned off causing a voltage level of the negative voltage node to rise above the predetermined negative voltage level, and wherein the charge pump is configured to operate at an increased frequency to drive the negative voltage node back to the predetermined negative voltage level within a predetermined period of time.

5. The switch activation system of claim 1, further comprising activation control circuitry configured to control the plurality of activation signals, wherein the activation control circuitry is configured to assert a bypass signal to bypass the break done signal so that the first one of the plurality of electronic switches is turned on in response to assertion of the first one of the plurality of activation signals.

6. The switch activation system of claim 1, wherein the switch driver comprises:
switch activation circuitry that is configured to couple a corresponding one of a plurality of control terminals to either one of a drive voltage and the negative voltage node based on a state of an on signal; and
switch enable circuitry that is configured to control the on signal based on the break done signal and a corresponding one of the plurality of activation signals.

7. The switch activation system of claim 6, wherein the switch activation circuitry may further be configured to couple a corresponding one of a plurality of body connections to either one of a supply reference node and the negative voltage node based on the state of the on signal.

8. The switch activation system of claim 1, wherein the charge pump comprises:
a voltage regulator that is configured to generate a regulated target voltage level with respect to a reference voltage level, wherein the regulated target voltage is indicative of a magnitude of the predetermined negative voltage level;
first pump circuitry that is configured pump a differential voltage having a magnitude of the regulated target voltage level between the negative voltage node and a feedback node;
second pump circuitry that is configured to pump the negative voltage down from a reference voltage node having the reference voltage level by an amount of the regulated target voltage level;
a self resetting comparator that is configured to compare a voltage of the feedback node with the reference voltage level to provide a pump signal having a frequency based on a voltage difference between the feedback node and the reference voltage level; and
flip-flop circuitry having a clock input receiving the pump signal that is configured to generate at least one pump signal used to drive the first pump circuitry and the second pump circuitry.

9. The switch activation system of claim 1, wherein the load monitor comprises:
a first current source driving a first current level into a first node;
a second current source driving the first current level into an output node;
a first N-channel transistor having a drain and gate terminals coupled to the first node and having a source terminal coupled to a second node;
a second N-channel transistor having a drain terminal coupled to the output node, having a gate terminal coupled to the first node, and having a source terminal coupled to an intermediate node;
a third N-channel transistor having a drain terminal and a gate terminal coupled together at the second node and having a source terminal coupled to a supply reference node;
a fourth N-channel transistor having a drain terminal and a gate terminal coupled together at the intermediate node and having a source terminal coupled to the supply reference node, wherein the third N-channel transistor is larger than the fourth N-channel transistor;
an inverter having an input coupled to the output node and having an output providing the break done signal; and
a capacitor coupled between a feedback node of the charge pump and the intermediate node of the load monitor, wherein the feedback node has a voltage level indicative of a voltage level of the negative voltage node.

10. The switch activation system of claim 1, wherein the charge pump is configured to operate at a frequency based on a difference between a voltage level of the negative voltage node and the predetermined negative voltage level.

11. A method of controlling activation of a plurality of electronic switches, comprising:
pumping charge to drive a negative voltage node to a predetermined negative voltage level;
monitoring a voltage level of the negative voltage node and asserting a break done signal when a voltage level of the negative voltage node is decreasing back to the predetermined negative voltage level after having been increased;
detecting assertion of a first one of a plurality of activation signals for turning on a corresponding first one of the plurality of electronic switches; and
turning on the corresponding first one of the plurality of electronic switches only after the break done signal is asserted.

12. The method of claim 11, further comprising:
detecting de-assertion of a second one of a plurality of activation signals for turning off a corresponding second one of the plurality of electronic switches; and
turning off the corresponding second one of the plurality of electronic switches by coupling a control terminal of the corresponding second one of the plurality of electronic switches to the negative voltage node.

13. The method of claim 12, further comprising turning off the corresponding second one of the plurality of electronic switches by coupling a body connection of the corresponding second one of the plurality of electronic switches to the negative voltage node.

14. The method of claim 11, further comprising:
detecting a voltage level of the negative voltage node increasing above the predetermined negative voltage level; and
wherein the pumping charge comprises pumping charge at an increased frequency to drive the negative voltage node back to the predetermined negative voltage level within a predetermined period of time.

15. The method of claim 11, further comprising:
determining that the first one of the plurality of electronic switches may be turned on without causing conflict with any of the other plurality of electronic switches; and
asserting a bypass signal to bypass the break done signal with assertion of the first one of the plurality of activation signals.

16. The method of claim 11, further comprising:
coupling a corresponding one of a plurality of control terminals to either one of a drive voltage and the negative voltage node based on a state of an on signal; and
controlling the on signal based on the break done signal and a corresponding one of the plurality of activation signals.

17. The method of claim 16, further comprising coupling a corresponding one of a plurality of body connections to either one of a supply reference node and the negative voltage node based on a state of the on signal.

18. The method of claim 11, wherein the pumping charge to drive a negative voltage node to a predetermined negative voltage level comprises:
generating a regulated target voltage level with respect to a reference voltage level comprising a magnitude of the predetermined negative voltage level;
pumping a differential voltage having a magnitude of the regulated target voltage level between the negative voltage node and a feedback node at a frequency of a pump signal;
pumping the negative voltage down from a reference voltage node having the reference voltage level by an amount of the regulated target voltage level at a frequency of the pump signal; and
comparing a voltage of the feedback node with the reference voltage level for generating the pump signal having a frequency based on a voltage difference between the feedback node and the reference voltage level.

19. The method of claim 11, wherein the detecting assertion comprises:
holding an output node high during a steady state condition of current mirror circuitry having an intermediate node and the output node;
inverting the output node for providing the break done signal; and
momentarily pulling the output node low in response to the negative voltage node decreasing back to the predetermined negative voltage level after having been increased.

20. The method of claim 11, wherein the pumping charge comprises pumping charge at a frequency level based on a difference between a voltage level of the negative voltage node and the predetermined negative voltage level.

* * * * *